United States Patent [19]
Kittler et al.

[11] Patent Number: 5,761,065
[45] Date of Patent: Jun. 2, 1998

[54] ARRANGEMENT AND METHOD FOR DETECTING SEQUENTIAL PROCESSING EFFECTS IN MANUFACTURING

[75] Inventors: Richard Charles Kittler, Sunnyvale; Zhi-Min Ling, San Jose; James Minsu Pak, Sunnyvale; Yung-Tao Lin, Fremont; Ying Shiau, San Jose, all of Calif.

[73] Assignee: Advanced Micro Devices, Inc., Sunnyvale, Calif.

[21] Appl. No.: 413,990

[22] Filed: Mar. 30, 1995

[51] Int. Cl.$^6$ .................................................. C07C 2/68
[52] U.S. Cl. ........................ 364/468.24; 364/468.24; 364/468.28; 364/489; 364/490; 382/226; 382/228; 348/128; 348/598; 348/21; 348/6; 348/14; 348/46
[58] Field of Search ................... 364/468, 468.28, 364/468.24, 489, 490; 348/6, 128, 21, 598, 14, 46; 382/226, 228

[56] References Cited

U.S. PATENT DOCUMENTS

| | | | |
|---|---|---|---|
| 5,226,118 | 7/1993 | Baker et al. | 395/161 |
| 5,450,326 | 9/1995 | Black | 364/148 |

OTHER PUBLICATIONS

"Wafer Tracking of Age" by Dr. Gary M. Scher, Semiconductor International, May 1991, pp. 126–131.

"Optimizing Polysilicon Deposition on Thin Oxides" by John Franka et al., Semiconductor International, May 1991, pp. 194–197.

"In–Line Statistical Process Control and Feedback for VLSI Integrated Circuit Manufacturing" by Gary Scher et al., IEEE Transactions on Components and Manufacturing Technology, vol. 13, No. 3, Sep. 1990, pp. 484–489.

"Using Wafer Level Tracking for Problem Solving and Process Improvement" Gary Scher et al.

*Primary Examiner*—Reba I. Elmore
*Assistant Examiner*—McDieunel Marc

[57] ABSTRACT

An arrangement and method for detecting sequential processing effects on devices to be manufactured in a manufacturing process extracts data regarding responses of the devices to a process step in the manufacturing process and data regarding a processing sequence of the devices in that process step. The extracted data is refined before analysis and control chart rules are then applied to the refined data. These control chart rules detect whether there are any unusual processing effects caused by the sequence of processing of the devices in any one of the individual processing steps. Application of control chart rules to the refined data allows an automatic determination of whether there are any rule violations. One or more control charts which have a rule violation are automatically generated when it is determined that there is a rule violation. Process engineers may then use the automatically generated charts to direct their efforts at improving the manufacturing process.

28 Claims, 6 Drawing Sheets

ARRANGEMENT AND METHOD FOR DETECTING SEQUENTIAL PROCESSING EFFECTS IN MANUFACTURING

BACKGROUND OF THE INVENTION

1. Technical Field of the Invention

The present invention relates to the field of manufacturing of devices, such as semiconductor devices, and more particularly, to the improvement of manufacturing processes for these devices. By comparing response variables with a process sequence of devices, the sources of variation due to the order of processing of devices through the process steps in the manufacturing process are determined.

2. Description of Related Art

The manufacture of most devices, such as semiconductor devices, requires a number of discrete processing steps to create the device. For the example of semiconductor devices, a number of discrete steps are needed to produce a packaged semiconductor circuit device from raw semiconductor material. The starting substrate is usually a slice of single crystal silicon referred to as a wafer. Circuits of a particular type are fabricated together in batches of wafers called "lots" or "runs". The fabrication process creates regular arrays of a circuit on the wafers of a lot. During processing, the individual wafers in a lot may go through individual processing steps one at a time or as a batch. At the completion of wafer processing the wafers are tested to determine circuit functionality. Later the wafers are sliced, the functioning devices are packaged, and further testing occurs prior to use by the customer.

Data gathered during the course of wafer processing is used to diagnose yield problems and forms the basis of yield improvement efforts. Such data includes parametric electrical test data gathered on individual circuits and test structures fabricated on the wafers, as well as test data referred to as wafer sort data which tests the suitability for use once wafer processing is completed.

One of the possible sources of yield variation is the order at which wafers in a lot are processed at a given processing step. When the processing is done one wafer at a time at a step, a variation in yield may be due to build up of contaminants, heating of a processing chamber, or another physical effect which changes during the processing of the lot. In a batch operation, the physical location of the wafer in the batch processing equipment may influence uniformity of the processing effects across the lot. The benefits of tracking the order of wafer processing at critical processing steps and correlating this processing order to device performance (i.e., examining a linear correlation coefficient) in order to improve yields is well known. See, for example, "Wafer Tracking Comes of Age", Gary Scher, Semiconductor International (May 1991, pp. 126–131).

As an example, consider a critical lithography step in which the wafers in a lot are processed one at a time through a lithography system called a stepper. Assume that there is a contamination problem which causes contamination to build up on the chuck holding the wafer in place during exposure which worsens with each wafer processed. Normal practice may require the chuck to be cleaned prior to each lot being started. The contamination buildup causes the upper wafer surface to deviate from the ideal focal plane during exposure and irregular features are produced upon exposure. If the order in which each wafer is processed is known, then the final wafer yield may be plotted against the processing order in this step. In this example, for each wafer in the lot a drop-off in yield with processing order would be observed due to the contamination problem. Armed with this knowledge, process engineers responsible for this step could then begin work on fixing the problem and hence improving yield and profitability.

The tracking of the wafer processing order requires that specialized equipment be used to read scribed wafer identifiers either immediately prior to or after critical processing steps and that this data be stored for later correlation with device performance. Randomizing the order of the wafers prior to such steps is often done to ensure effects are not confounded.

In prior analysis practice, the wafer positional data is fed into a computer system, the device performance metrics for a wafer lot of interest are manually entered, and then all possible graphs of the device metrics for that lot versus wafer processing order at each step are generated. An analyst reviews the graphs and examines linear correlation coefficients to determine those steps at which the processing order may affect performance by manually discerning trends in the graph plots. This process is tedious and inefficient. It also has no provision for examining multiple wafer lots simultaneously to more easily discern systematic effects, nor does it contain any provision for automatic trend detection.

SUMMARY OF THE INVENTION

There is a need for a systematic method and arrangement for the automatic detection of sources of variation due to sequential processing effects across the large number of processing steps used to manufacture devices, such as semiconductor circuits. Such a method may be used to direct efforts in reducing process variability and therefore improve the profitability of manufacture.

This and other needs are met by the present invention which provides a method for detecting sequential processing effects on devices to be manufactured in a manufacturing process. Data regarding responses of the devices to a process step in the manufacturing process is extracted, as is data regarding a processing sequence of the devices in that process step. The data is refined before analysis and control chart rules are then applied to the refined data. These control chart rules detect whether there are any unusual processing effects caused by the sequence of processing of the devices in any one of the individual processing steps. Application of control chart rules to the refined data allows an automatic determination of whether there are any rule violations. One or more control charts which have a rule violation are automatically generated when it is determined that there is a rule violation. Process engineers may then use the automatically generated charts to direct their efforts at improving the manufacturing process.

The earlier stated needs are also met by another aspect of the present invention which provides an arrangement for detecting sequential processing effects on devices to be manufactured in a manufacturing process, comprising at least one processing apparatus that performs at least one processing step on the devices, a detector that detects a response variable of the devices, and a data processor that plots the response variable for each device against a processing sequence of the devices in that processing step. The data processor applies control chart rules to the plots, determines whether there are any rule violations based on the application of the control chart rules to the plots, and generates a control chart having a rule violation in response to the determination of a rule violation.

The arrangement and method of the present invention can be used to direct efforts in reducing process variability and therefore improve the profitability of manufacture. The automatic generation of charts which violate the rules, indicating a systematic effect due to the processing sequence, relieves process engineers from the tedious task of sifting through numerous plots of data to discern sequential processing effects.

The foregoing and other features, aspects and advantages of the present invention will become more apparent from the following detailed description of the present invention when taken in conjunction with the accompanying drawings.

DESCRIPTION OF THE ILLUSTRATIVE EMBODIMENTS

The present invention will be described in the context of the manufacture of semiconductor devices. This is exemplary only, however, as the method of the invention is applicable to the manufacture of other types of products produced by a plurality of processing steps.

Figure 1:
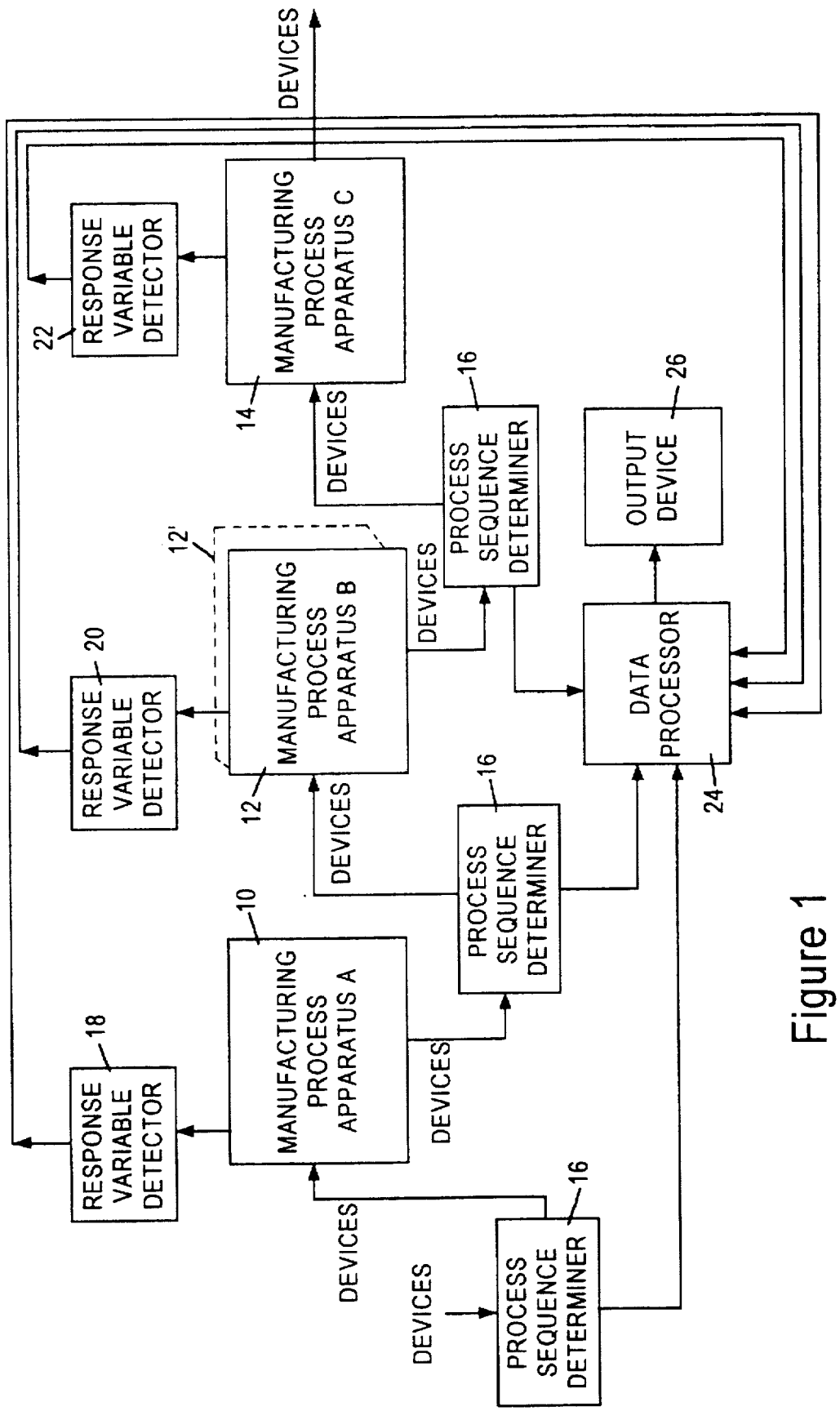
FIG. 1 is a block diagram of a manufacturing arrangement and a process analysis device constructed in accordance with an embodiment of the present invention.

FIG. 1 is a block diagram depicting a semiconductor device processing arrangement and an arrangement for analyzing the process. The semiconductor wafers are processed (as indicated by the arrows) in a sequence by a plurality of manufacturing process apparatuses 10–12. A first manufacturing process apparatus "AA" (reference numeral 10) performs one or more manufacturing process steps on a plurality of wafers in a known sequence of the wafers. The sequence is determined by the use of a process sequence determiner 16, such as a conventional scribe reader that reads wafer identification information that is scribed on the individual wafers.

After processing by the manufacturing process apparatus A (10), the wafers then undergo processing by manufacturing process apparatus "B" (reference numeral 12). One or more processing steps are performed by this manufacturing process apparatus B (12). The processing sequence of the wafers is determined again by another process sequence determiner 16. This processing sequence is changed in preferred embodiments from the processing sequence of the wafers for the process steps performed by manufacturing process apparatus A (10). The changing of the processing sequence between processing steps prevents confounding of any processing sequence effects.

A third manufacturing process apparatus "C" (reference numeral 14) performs further processing step(s) on the wafers in a different processing sequence of the wafers.

In order to perform the process analysis of the present invention, response variable detectors 18, 20, and 22 are provided at the individual manufacturing process apparatuses 10, 12, and 14. These response variable detectors 18–22 detect at least one response variable of the device that is being manufactured, such as a wafer. For example, the response variable may be the threshold voltage across the wafers, or it may be a degree of wafer streaking after a polysilicon etching of the wafers. The response variable detectors 18–22 may detect the same or different response variables according to the manufacturing process apparatus 10–14 with which the individual detector is associated.

In certain preferred embodiments, only one response variable detector is used to measure a desired response variable of the devices after all of the processing steps are completed.

The data detected by the response variable detectors 18–22 is collected by a data processor 24. After processing this data, the data processor 24 applies control chart rules to the data and provides the control charts for which a control chart rule was violated to an output device 26. The output device 26 may be a printer or a video display, for example.

Figure 6:
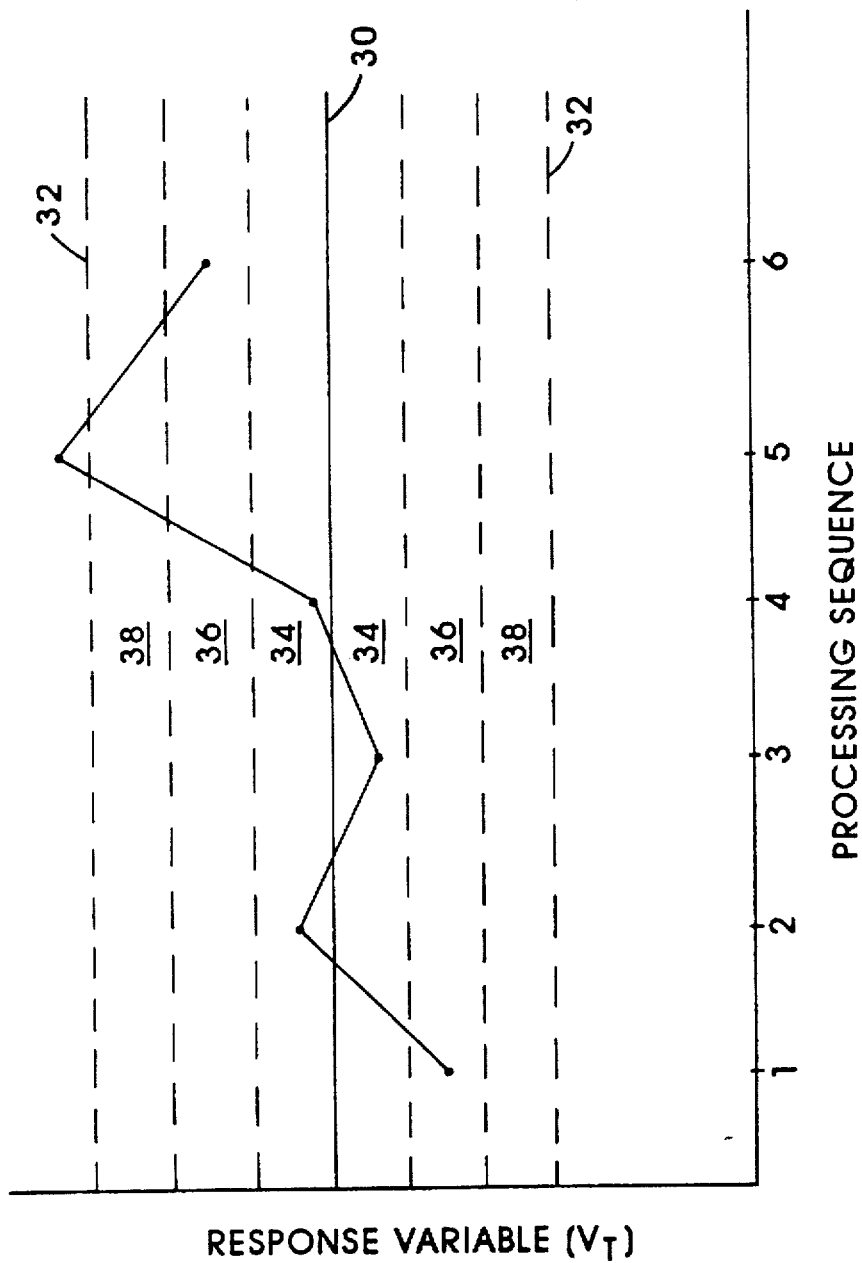
FIG. 6 is a control chart depicting the different sigma zones for explanation of the use of Western Electric control chart rules.

Control charts are plots of a response variable against some series of sampling points forming a fluctuating pattern and having statistical limits. The statistical limits provide a reference for determining whether the process is in control or whether there is a lack of control. An example of a so-called "Shewhart" control chart is provided in FIG. 6 and depicts the threshold voltage across a wafer plotted against the position of a wafer in a processing step. The control chart has a centerline 30 formed by averaging the response variables for each of the points. The statistical limits are determined according to well-known statistical formulas (see for example, the "Statistical Quality Control Handbook", AT&T Technologies, Del Mar Printing, Charlotte, N.C. (1956, page 7). These statistical limits are provided with reference numeral 32, and are often referred to as 3 sigma control limits.

Shewhart charts have long been used in process control applications to detect excursions of manufacturing process variables due to assignable causes. The typical use of Shewhart charts is in manufacturing situations in which there is a constant flow of material and a periodic sampling of this constant flow of material is performed to measure a certain characteristic. A chart is plotted with the response variable along the vertical axis and a sample identifier, commonly referred to as the subgroup, is plotted along the horizontal axis in the order which the samples were taken. Non-random excursions of the response variable are detected by applying a set of rules, such as the "Western Electric rules", to the latest points on the plot. These rules are based on the statistical likelihood of such events as a 3-sigma deviation from the mean, so many points in a row either above or below the mean, etc. Further explanation of Shewhart charting and Western Electric rule usage can be found in most introductory text books on process control applications in manufacturing, such as the "Statistical Quality Control Handbook", supra.

Although Shewhart charts have been used in the past to analyze continuous flow processes, the use of such charts and the application of Western Electric control rules to the charts to analyze data within a batch of devices has not been described in the prior art. The automatic detection of sequential processing effects is made possible, however, by the use of Shewhart charts and the application of control rules as in the present invention. This makes the detection of sequential processing effects in the manufacture of semiconductor devices, for example, less tedious and time consuming for process engineers.

Preferred embodiments of the present invention produce Shewhart "individual" charts and "moving range" charts of the response variable plotted against processing sequence for each processing step. Such charts are well known to those of ordinary skill in the art and are described in the "Statistical Quality Control Handbook", supra. If desired, the data may be further subdivided to produce separate charts for each particular machine processing apparatus at each step. The individuals and moving range charts are used in preferred embodiments due to their sensitivity to the component of variation between subgroups. Since the subgroups in integrated circuit manufacturing represent the order at which the wafers of each lot were processed at a step, a chart which is sensitive to the component of variation between subgroups is most useful.

Referring back to FIG. 6, for purposes of analysis, the areas within the 3 sigma control limits 32 can be further subdivided into three sigma control zones. The first zone is the 1 sigma control zone 34, closest to the centerline 30 on both sides. The second zone is the 2 sigma control zone 36, and the third zone is the 3 sigma control zone 38. Based on where the plotted points fall in relation to these three zones, the application of control chart rules will determine whether there is any statistical significance to the variability due to the processing sequence of the wafers.

Control chart rules are well known, and one set of rules is known as the Western Electric rules. For instance, in order to test for statistical significance, it is determined whether any point falls outside of the 3 sigma control zone 38. This indicates that the plot of points is unnatural and the particular process step should be investigated further. Another test (or rule) is whether two out of three successive points fall within 3 sigma control zone 38 or beyond. A further test is whether four out of five successive points fall in the 2 sigma control zone 36 or beyond. A still further test is whether eight successive points fall in the 1 sigma control zone 34 or beyond (in other words, on one side of the centerline 32).

Based on the gathered data for the various process steps performed by the different manufacturing process apparatuses 10, 12, 14, the data processor 24 plots the response variable in relation to the wafer position and then applies control chart rules, such as the Western Electric rules, to the plots. When there is a chart rule violation in one of the plots, indicating statistical significance to the processing sequence of the wafers, the data processor 24 creates the chart with the output device 26. A process engineer can then use this generated chart to conduct testing on the processing step and plan a corrective course of action. Since only charts with rule chart violations are generated, the process engineer does not have to sift through a plethora of charts to determine which ones have statistical significance for the processing sequence.

In certain preferred embodiments of the invention, the data processor 24 will generate charts in an order that is determined based on the specific rule which has been violated and prior experience with the importance of specific rule violations to the given application. The information contained within these charts is then used to prioritize the efforts of engineering groups responsible for those process steps in the manufacturing area at which there were rule violations. Further investigation may be warranted to understand the significance of the signals produced by the rule violations. After further characterization and consideration of cost issues, it may be desirable to eliminate a particular source of process sequence variation which has been highlighted by the above method.

Figure 2:
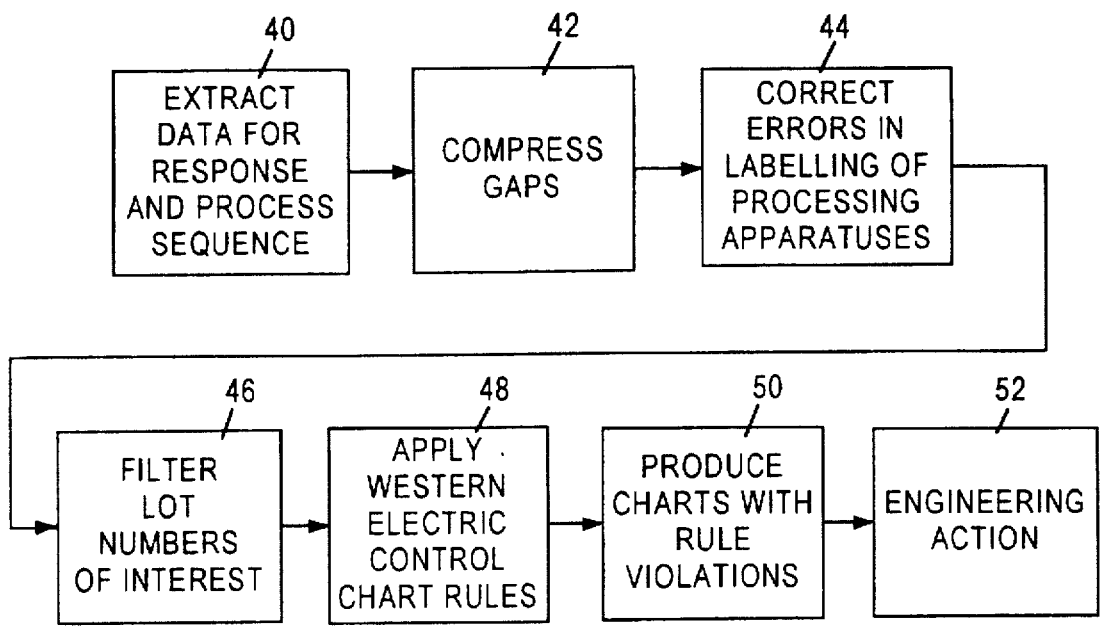
FIG. 2 is a flow chart of an exemplary embodiment of the method of the present invention.

An embodiment of the overall method of the present invention is depicted in FIG. 2. In a first step 40, the response variable data from the response variable detectors 18–22 and the process sequence determiners 16 are extracted by the data processor 24. In step 42, gaps in the numerical recording are compressed by the data processor 24, as will be described in more detail later.

After compression, errors in the labelling of the manufacturing processing apparatus 10–14 are corrected in step 44. In the actual arrangement of the manufacturing process devices 10–14, a plurality of apparatuses may be used to perform the same process step on different lots of wafers. This is indicated by the manufacturing process apparatus 12'. It is often the case that these apparatus labels (or identifiers) are entered manually into the data processor 24 and are therefore subject to data entry errors. Hence, correction of errors in the labeling of the apparatuses used is necessary when it is to be determined whether individual pieces of apparatus at a given processing step behave differently with respect to their ability to produce desired device performance. This correction may be performed using any of a number of algorithms based on a closest pattern match to select the correct apparatus when labelling errors are detected.

An additional step that is provided in certain preferred embodiments is the filtering of lots of interest (step 46). This step is performed if the dataset contains more data than is of interest for the current investigation. For example, it may be desirable to restrict the data to one or more lots of interest, or to those lots which went through a specific step during a certain period of time.

After the data has been refined in steps 42, 44 (and optionally step 46), collectively referred to as the data refining steps, the control chart rules are applied in step 48 to the data represented in the plots in the manner described earlier to determine if there are rule violations. The charts with rule violations are generated in step 50 and appropriate engineering action is taken in step 52.

Figure 3:
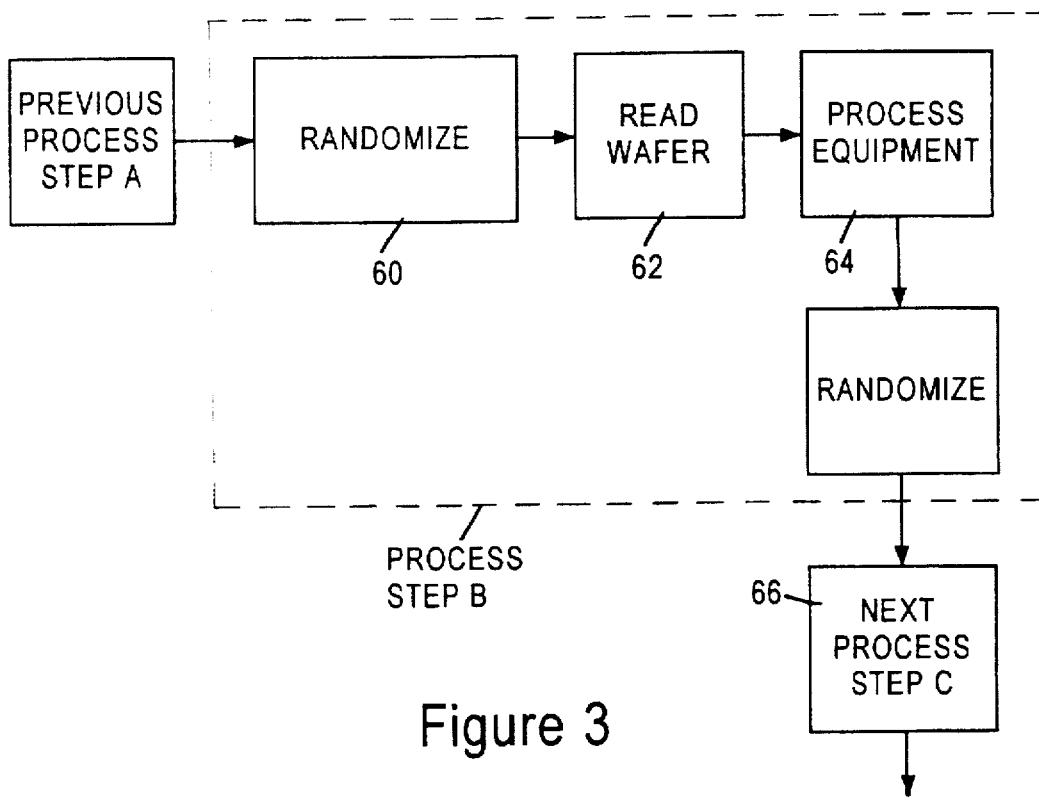
FIG. 3 is a flow chart of a process for collecting process sequence data from a step of an exemplary manufacturing process in accordance with an embodiment of the present invention.

An embodiment of the method for extraction of the response variables and the processing sequence (i.e. the collection of the process sequence data) is depicted in FIG. 3 for a single process step B. From the previous process step A, the wafers are randomized in step 60 to confound any error. The identifications of the wafers are then made in step 62 by one of the process sequence determiners 16. The wafers then undergo the specific processing step in step 64. After processing, the wafers are again randomized in step 66 prior to being processed in process step C. The use of compression as in step 42 of the method of the invention depicted in FIG. 2 refines the data prior to the plotting of the response variable against the processing sequence. The compression of sequence information across gaps in the numerical recording is necessary, for example, in cases in which there are empty slots in the cassettes holding the wafers when they are being read, but these gaps are eliminated when the wafers are loaded into the processing equipment.

Figure 4:
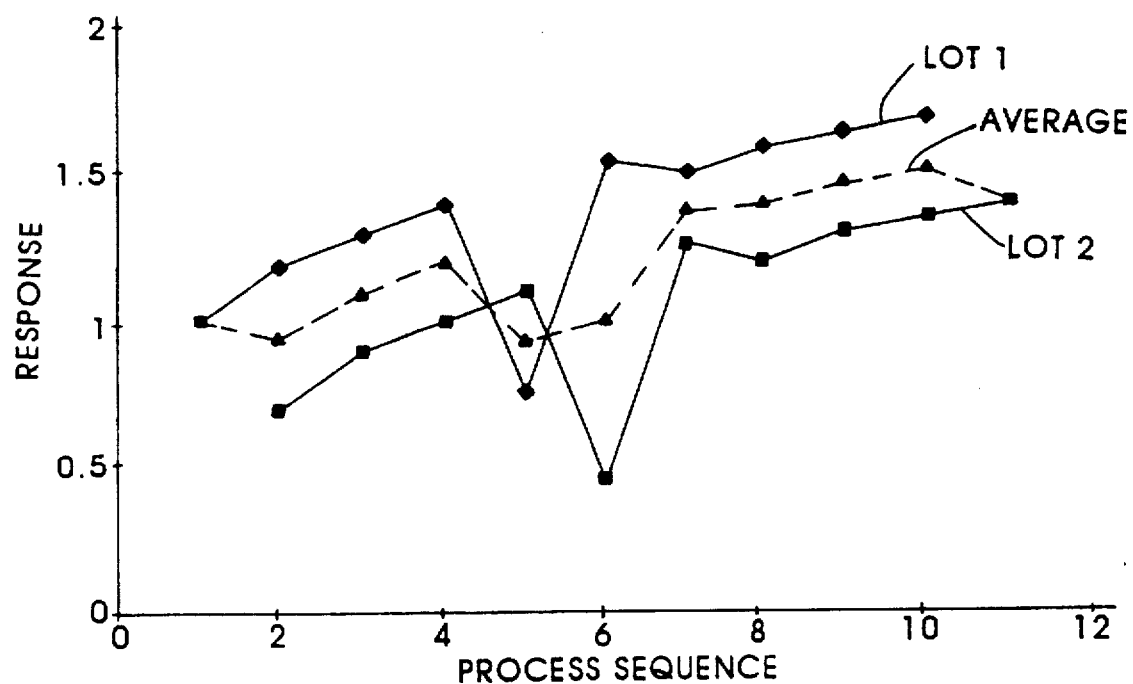
FIG. 4 is an exemplary control chart prior to compression.
Figure 5:
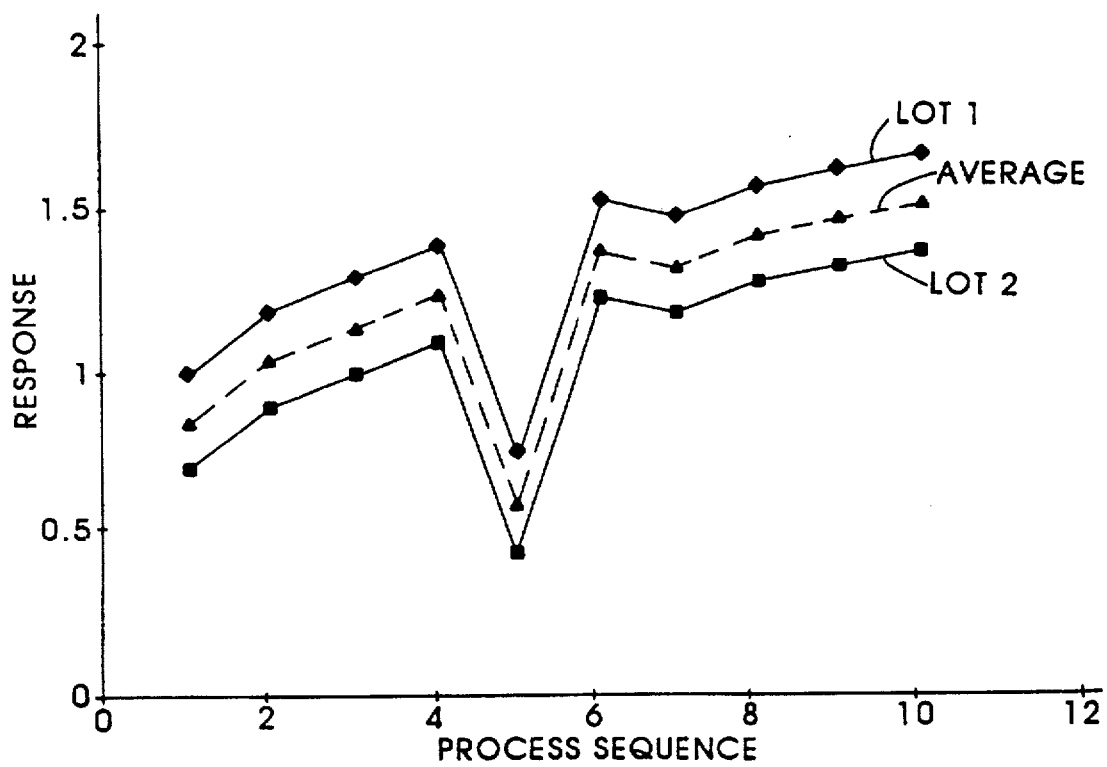
FIG. 5 is an exemplary control chart containing the same information as the control chart of FIG. 4, but after compression.

FIGS. 4 and 5 illustrate the need for compression in order to provide an accurate picture to the data processor 24 of any sequential processing effects. In FIG. 4, lot 1, with ten devices, has been processed and the response variable measured. A second lot, lot 2, has also been processed, but for some reason such as an empty slot in the cassette, the numerical recording of the first device in that lot is registered as two. The last device of that lot is registered as device eleven. An average of the response variable for lot 1 and lot 2 does not yield a sharp dip, as do the plots of the individual two lots.

After compression of any gaps in the data, the average of the response variable will present a more accurate picture of any sequential processing effects. As seen in FIG. 5, the same lots as in FIG. 4 are illustrated. However, lot 2 has been compressed to remove the gap between device 1 and device 2. In this example then, the entire plot of lot 2 is shifted to the left by one position. The average of the two lots now exhibits a sharp dip at device 5 in the processing sequence, and hence accurately portrays the response vs. processing sequence for that process step.

Figure 7:
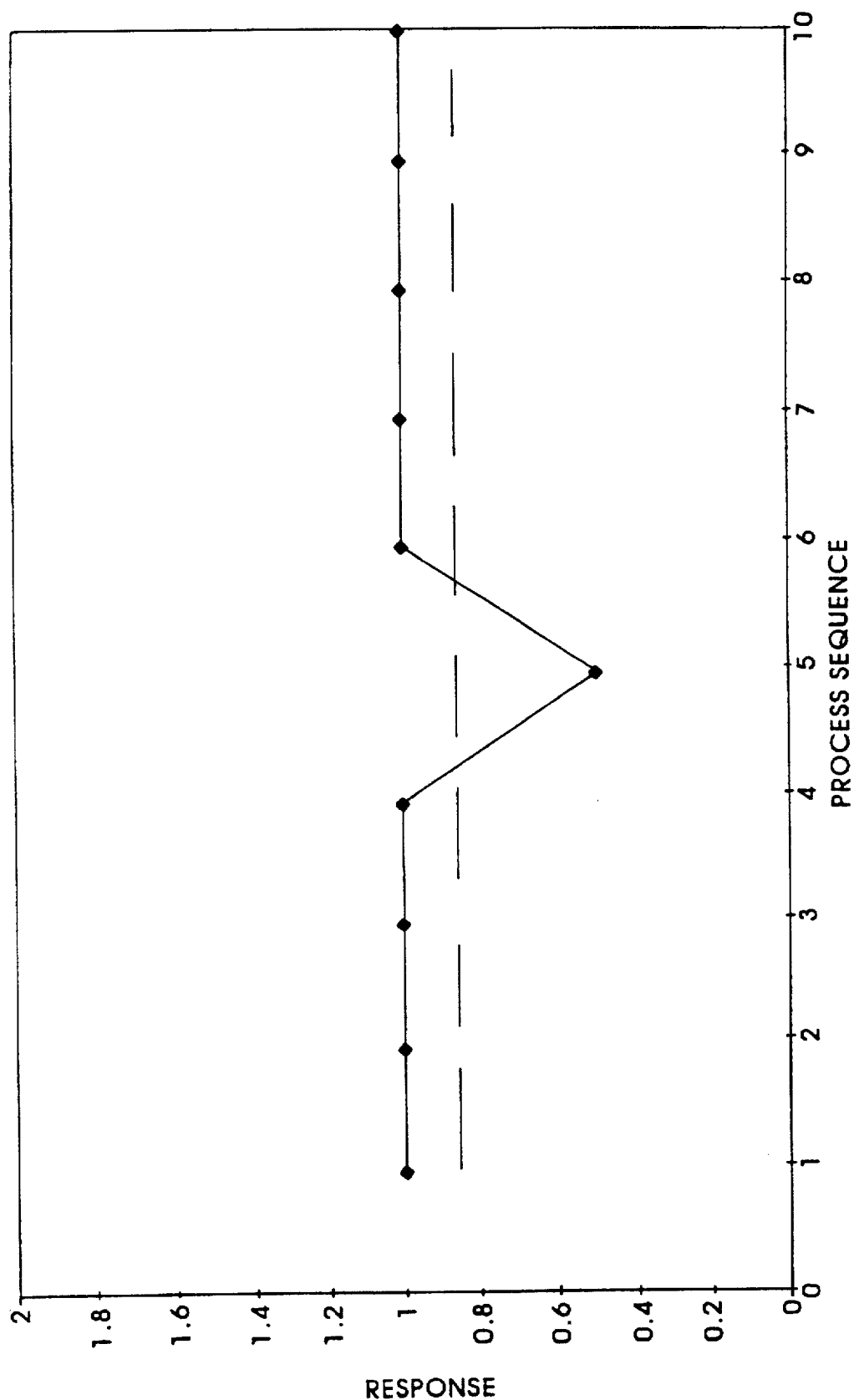
FIGS. 7 and 8 are examples of Shewhart charts.
Figure 8:
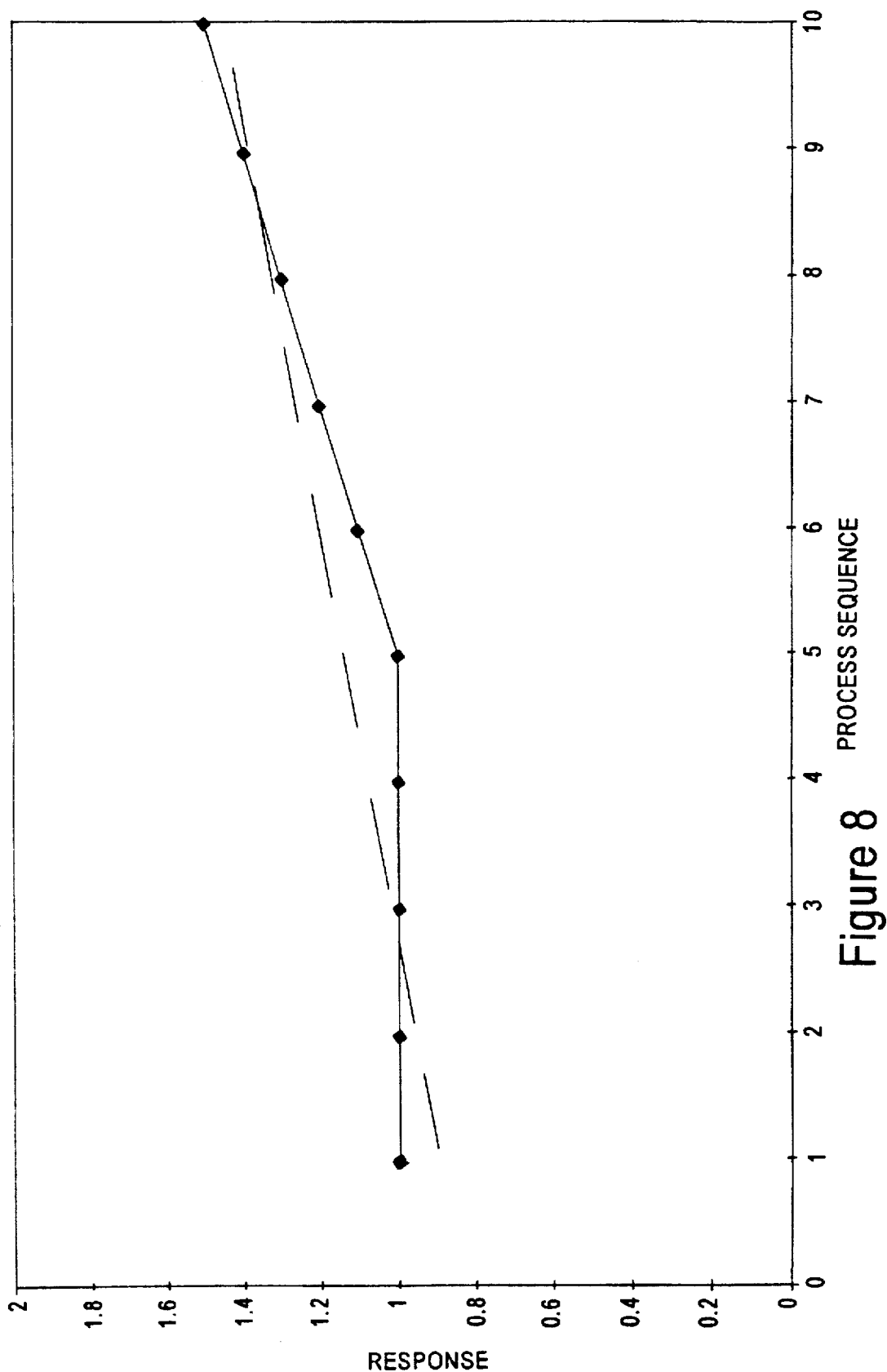

The application of Shewhart charts and Western Electric control rules to the Shewhart charts within a batch or individual lot as in the present invention allows the detection of sequential processing effects in the manufacturing of devices that would be missed using other detection methods. FIGS. 7 and 8 are exemplary plots that illustrate this advantage of the present invention over the prior art detection methods that produce and examine a linear correlation coefficient for scatter plots.

FIG. 7 depicts a 3 sigma rule violation in which devices 1–4 and 6–10 in the processing sequence all have a response of 1.0, but device 5 has a response below 0.5, out of the 3 sigma zone. Applying the Western Electric rules to this plot as in the present invention reveals a chart rule violation and identifies this process step as one that should be investigated further by process engineers. Using the prior art method of producing a linear correlation coefficient, however, a response average just above 0.8 is realized, as indicated by the dashed line. This line has a correlation coefficient of zero and the prior art would therefore miss the processing effect that is present.

FIG. 8 is another example of process sequence variability which is detected using the present invention, but would not by the use of linear correlation coefficients as in the prior art. In this example, there is no variability in process sequence through position 5 at which point there is a gradual increase upward in the response. A line that is fitted to this data yields the dashed curve. Since the slope of the line is small, the linear correlation coefficient is also small and therefore the prior art would again detect no effect. However, the application of control chart rules, such as the Western Electric rules, would detect the effect due to the rule that makes it improbable that so many points in a row would be monotonically increasing due to random chance.

Hence, the present invention will detect sequential processing effects that would be missed by methods employed by the prior art. Further, the arrangement and method of the present invention for detecting sequential processing effects in manufacturing described above may be advantageously utilized to detect effects in processes other than that of the manufacture of integrated circuit devices.

Although the present invention has been described and illustrated in detail, it is clearly understood that the same is by way of illustration and example only and is not to be taken by way of limitation, the spirit and scope of the present being limited only by the terms of the appended claims.

We claim:

1. A method for detecting sequential processing effects on devices to be manufactured in a manufacturing process, comprising:

extracting data regarding responses of the devices to a process step in the manufacturing process and data regarding a processing sequence of the devices in that process step;

refining the data;

applying control chart rules to the refined data;

determining whether there are any rule violations based on the application of the control chart rules to the refined data; and generating a control chart having a rule violation only when it is determined that there is a rule violation.

2. The method of claim 1, further comprising numerically recording the processing sequence of the devices in the process step.

3. The method of claim 2, wherein the step of refining the data includes compressing gaps in the numerical recording of the devices.

4. The method of claim 1, wherein the control chart rules are Western Electric control chart rules.

5. The method of claim 1, wherein the control chart is a Shewhart control chart.

6. The method of claim 5, wherein the Shewhart control chart is an individual and moving range chart.

7. The method of claim 1, wherein the step of extracting data includes extracting data regarding responses of the devices of a plurality of process steps in the manufacturing process and data regarding the processing sequence of the devices for each of those process steps.

8. The method of claim 7, wherein the step of applying the control chart rules includes applying the control chart rules to the refined data for each of the process step.

9. The method of claim 8, wherein the step of determining includes determining whether there are any rule violations based on the application of the control chart rules to the refined data of any of the process steps, and the step of generating includes generating each control chart having a rule violation when it is determined that there is a rule violation.

10. The method of claim 9, wherein the step of generating each control chart having a rule violation includes ordering the generation of control charts as a function of the specific rule violations.

11. An arrangement for detecting sequential processing effects on devices to be manufactured in a manufacturing process, comprising:

at least one processing apparatus that performs at least one processing step on the devices;

a detector that detects a response variable of the devices;

a data processor that plots the response variable for each device against a processing sequence of the devices in that processing step, applies control chart rules to the plots, determines whether there are any rule violations based on the application of the control chart rules to the plots, and generates a control chart having a rule violation only in response to the determination of a rule violation.

12. The arrangement of claim 11, further comprising a process sequence determiner that numerically records the processing sequence of the devices through the processing step performed by the processing apparatus.

13. The arrangement of claim 12, wherein the data processor includes means for compressing gaps in the numerical recording of the devices.

14. The arrangement of claim 11, wherein the control chart rules are Western Electric control chart rules.

15. The arrangement of claim 11, wherein the control chart is a Shewhart control chart.

16. The arrangement of claim 15, wherein the Shewhart control chart is at least one of an individual chart and a moving range chart.

17. The arrangement of claim 11, wherein the devices are semiconductor devices.

18. A method for detecting sequential processing effects on devices to be manufactured in a manufacturing process, comprising:
    extracting data regarding responses of the devices to a process step in the manufacturing process and data regarding a processing sequence of the devices in that process step;
    refining the data including compressing gaps in the data;
    applying control chart rules to the refined data;
    determining whether there are any rule violations based on the application of the control chart rules to the refined data; and
    generating a control chart having a rule violation when it is determined that there is a rule violation.

19. The method of claim 18, wherein the process step is performed on different lots of the devices by different manufacturing process apparatuses, each of the different process apparatuses having a specific identifier, the method further including labeling each of the lots of the devices with the specific identifier for the particular equipment sets that is performing the process step on the particular lot.

20. The method of claim 19, wherein the step of refining the data further includes correcting errors in labeling of the lots with the identifier for the process apparatuses.

21. The method of claim 20, wherein the step of correcting errors in labeling includes performing a closest pattern match of each process apparatus identifier to a list of known valid identifiers.

22. The method of claim 21, wherein the step of refining includes filtering of the lots of devices to at least one specific lot of interest.

23. An arrangement for detecting sequential processing effects on devices to be manufactured in a manufacturing process, comprising:
    at least one processing apparatus that performs at least one processing step on the devices;
    a detector that detects a response variable of the devices; and
    a data processor that plots the response variable for each device against a processing sequence of the devices in that processing step, compresses gaps in the numerical recording of device data, applies control chart rules to the plots, determines whether there are any rule violations based on the application of the control chart rules to the plots, and generates a control chart having a rule violation in response to the determination of a rule violation.

24. The arrangement of claim 23, further comprising a plurality of processing apparatuses that perform the processing step on different lots of the devices, each of the different processing apparatuses having a specific identifier, the method further including labeling each of the lots of the devices with the specific identifier for the particular processing apparatus that is performing the processing step on the particular lot.

25. The arrangement of claim 24, wherein the data processor includes means for correcting errors in labeling of the lots with the identifier for the processing apparatuses.

26. An arrangement for detecting sequential processing effects on devices to be manufactured in a manufacturing process, comprising:
    at least one processing apparatus that performs at least one processing step on the devices;
    a detector that detects a response variable of the devices; and
    a data processor that plots the response variable for each device against a processing sequence of the devices in that processing step, corrects errors and labeling of the lots with the identifier for the processing apparatuses, applies control chart rules to the plots, determines whether there are any rule violations based on the application of the control chart rules to the plots, and generates a control chart having a rule violation in response to the determination of a rule violation.

27. The arrangement of claim 26, wherein the step of correcting errors in labeling includes performing a closest pattern match of each process apparatus identifier to a list of known valid identifiers.

28. The arrangement of claim 27, wherein the data processor includes means for filtering of the lots of devices to at least one specific lot of interest.

* * * * *